United States Patent [19]

Dagostino

[11] 4,251,814
[45] Feb. 17, 1981

[54] TIME DOT DISPLAY FOR A DIGITAL OSCILLOSCOPE

[75] Inventor: Thomas P. Dagostino, Beaverton, Oreg.

[73] Assignee: Tektronix, Inc., Beaverton, Oreg.

[21] Appl. No.: 76,530

[22] Filed: Sep. 18, 1979

[51] Int. Cl.³ .............................................. G08B 5/36
[52] U.S. Cl. ................................ 340/722; 324/121 R; 340/799; 340/739
[58] Field of Search .................. 340/722; 324/121 R; 315/381, 385, 377

[56] References Cited

U.S. PATENT DOCUMENTS

| 2,280,531 | 4/1942 | Norgaard | 324/121 R |
| 2,565,839 | 8/1951 | Broadwell et al. | 324/121 R |
| 3,404,309 | 10/1968 | Massell et al. | 315/377 |
| 3,427,541 | 2/1969 | Middleton | 324/121 R |

Primary Examiner—David L. Trafton
Attorney, Agent, or Firm—George T. Noe

[57] ABSTRACT

A digital oscilloscope is provided with a display system which permits intensified time dots to be positionable between samples on a displayed waveform. The display system has a time dot memory having at least twice the number of addressable storage locations as a waveform memory. An address counter drives the time dot memory and the waveform memory, with time dot memory address count including one or more lesser significant bits than the waveform memory address count. The resolution of the time measurement provided by one or more time dots may be increased by increasing the time dot memory space and adjusting the corresponding number of address count bits to clock the memory at the commensurately higher rate.

5 Claims, 1 Drawing Figure

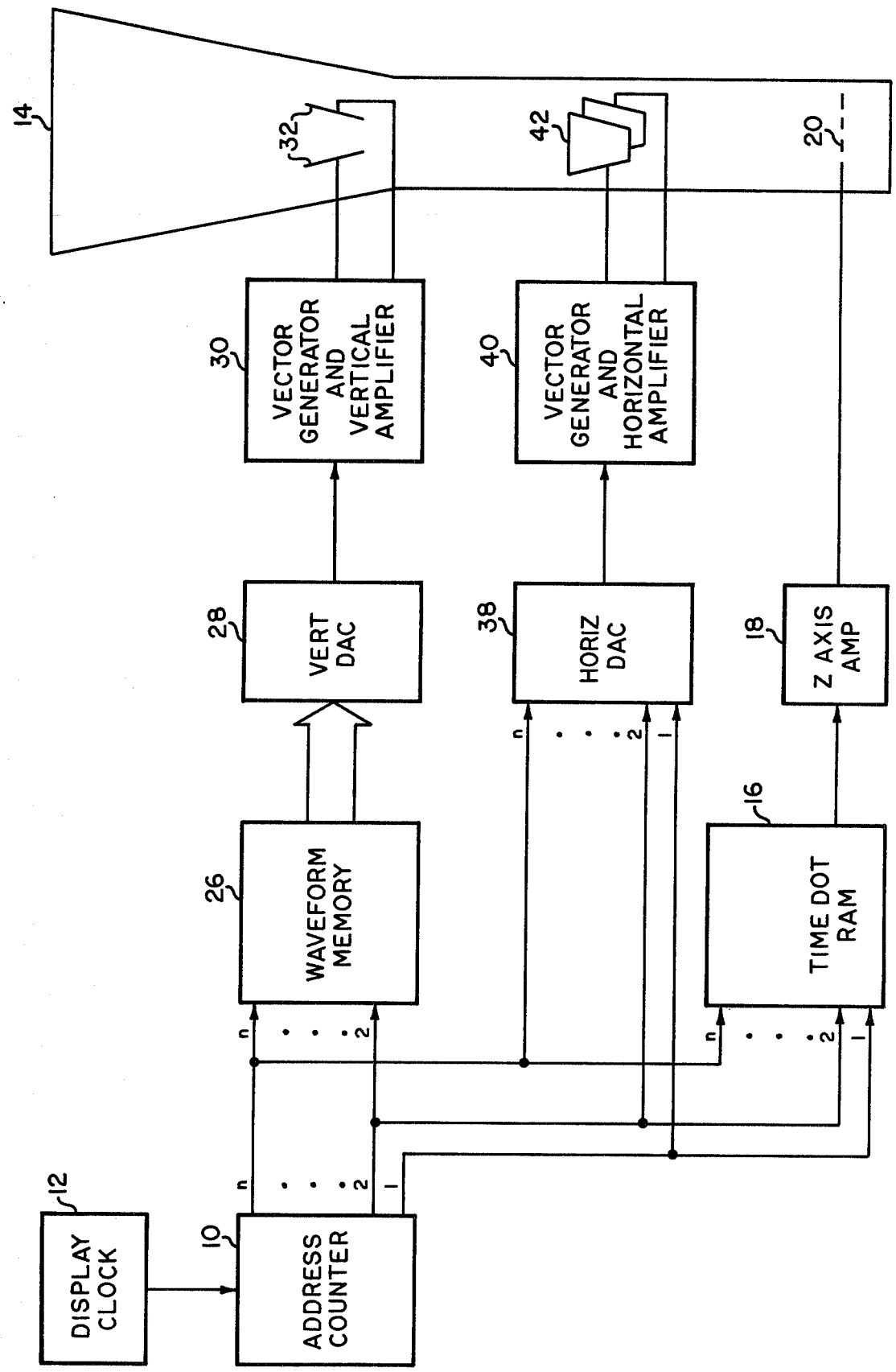

TIME DOT DISPLAY FOR A DIGITAL OSCILLOSCOPE

BACKGROUND OF THE INVENTION

This invention relates to display systems for digital oscilloscope in general, and in particular to a time dot display for superposition upon a displayed waveform.

In conventional digital storage oscilloscopes, the information displayed is a series of samples taken from the waveform of interest. The number of samples that may be taken from the waveform is limited by the available memory space. The samples are quantized and stored in memory in the form of digital data. The data is clocked out of memory at a predetermined clock rate, converted back to analog form, and displayed. The display may thus be a series of disconnected dots, or a vector generator may be utilized to connect the dots to produce a continuous display. A popular feature of digital oscilloscopes is the capability of reading out differential time by use of brightened dots placed on the waveform. In prior art systems, the time dots are generated in synchronism with the display clock so that the time dots appearing on the waveform are at the time position points of the sampled data. In positioning such time dots to provide a differential time readout, the displayed dots jump from point to point.

SUMMARY OF THE INVENTION

In accordance with a present invention, a time dot display for a digital oscilloscope is produced by linearly interpolating between the sampled and stored data being clocked out of memory for display. Both a waveform memory and a time dot memory are utilized as in conventional digital oscilloscopes, and data is clocked out of both memories by the same display clock and address counter. However, the time dot memory has a substantially greater number of addressable storage locations than the waveform memory, and is driven by a count signal having a lesser significant bit than the count signal utilized to drive the waveform memory. For example, for a binary system, the time dot memory has at least twice the number of addressable storage locations than the waveform memory so that it is possible to generate time dots half way between dots representing sampled data. For greater resolution, the time dot memory space is increased by a factor of $2^p$, where p is the number of lesser significant bits of the address count signal.

It is therefore one object of the invention to provide a novel method of producing a time dot display for a digital oscilloscope.

It is another object to provide a linear interpolation between time points on a waveform produced by a digital oscilloscope.

It is a further object to provide a time dot display having greater time measurement resolution in a digital oscilloscope.

It is an additional object to provide a simple and inexpensive method of generating time dots for a digital oscilloscope.

Other objects and advantages of the present invention will become apparent upon a reading of the following description when taken in conjunction with the drawings.

BRIEF DESCRIPTION OF THE DRAWING

The single FIGURE is a block diagram of the preferred embodiment in accordance with the present invention.

DETAILED DESCRIPTION OF THE PREFERRED EMBODIMENT

In the single FIGURE, a block diagram of the display system of a digital oscilloscope includes an address counter 10 which operates in response to a clock signal from a display clock 12 to synchronously drive the vertical, horizontal, and Z-axis circuits associated with a cathode-ray tube 14. The address counter 10 may suitably be a binary counter producing an n-bit binary count output. A time dot random-access memory (RAM) 16 is provided with $2^n$ addressable memory locations. Logical "1's" are loaded into one or more locations of the RAM 16 by a microprocessor or the like, and are clocked out of memory when the particular location is addressed by the n-bit count signal from address counter 10. The output of RAM 16, then, is a pulse having a time duration equal to the period of the display clock signal. This pulse is applied to a Z-axis amplifier 18, which amplifies the pulse and applies it to the control grid 20 of cathode-ray tube 14 to thereby provide an increase in a beam current to intensify the dot appearing on the associated display screen.

Waveform data to be displayed is stored in a waveform memory 26 having $2^{(n-p)}$ addressable storage locations, where p is the number of lesser significant bits of the address count signal. The waveform data being clocked out of memory is applied to a vertical digital-to-analog converter (DAC) 28 to be converted back to analog form. The output of DAC 28 is applied to a vector generator and vertical amplifier circuit 30, wherein the analog values are connected together to provide a continuous waveform which is amplified to a suitable level to drive vertical deflection plates 32 of the cathode-ray tube 14.

The n-bit count signal that is utilized to address the time dot memory locations is also utilized to provide the horizontal deflection signal. Thus, a horizontal DAC 38 receives the n-bit count signal from address counter 10 and converts it to a staircase signal which is applied to a vector generator and a horizontal amplifier 40, which in turn generates a linear ramp waveform to a level suitable to drive horizontal deflection plates 42 of the cathode-ray tube 14.

For the system shown, $p=1$, and therefore the time dot RAM 16 has twice the number of addressable storage locations that the waveform memory 16 has. The n-bit count signal applied to the time dot RAM 16 and horizontal DAC 38 includes the least significant bit of the n-bit count signal, while the count signal applied to the waveform memory 26 does not. Therefore, the storage locations of the time dot RAM 16 are addressed at a rate of twice that at which the waveform memory 26 is addressed, so that it is possible to provide intensified time dots half way between two waveform sample points. It can be appreciated, then, that if p=2, two lesser significant bit lines of the address count signal would be applied to the time dot RAM 16 that would not be applied to the waveform memory 26, resulting in the time dot RAM 16 being addressed at a rate four times that of the waveform memory 26. Therefore, as p is increased, the time measurement resolution is correspondingly increased.

While I have shown and described the preferred embodiment of my invention, it will be apparent to those skilled in the art that many changes and modifications may be made without departing from my invention in its broader aspects. I therefore intend that the appended claims cover all such changes and modifications as fall within the true spirit and scope of my invention.

What I claim as being novel is:

1. A display system for a digital oscilloscope, comprising:

A waveform memory having a predetermined number of addressable storage locations;

a time dot memory having at least twice the number of addressable storage locations as said waveform memory;

means for addressing both said waveform memory and said time dot memory in synchronism to produce waveform and time dot outputs therefrom respectively, said time dot memory being addressed at a rate at least twice that at which said waveform memory is addressed; and means for producing a display in which said waveform outputs are displayed graphically and said time dot outputs are superimposed thereon.

2. A display system in accordance with claim 1 wherein said time dot memory has $2^n$ memory locations and said waveform memory has $2^{n-p}$ memory locations, and said addressing means comprises a binary counter having an n-bit output coupled to said time dot memory and an (n−p)-bit output coupled to said waveform memory, wherein n is the total number of bits and p is a number of lesser significant bits.

3. A display system in accordance with claim 1 wherein said means for producing a display includes a cathode-ray tube having vertical and horizontal deflection systems and a control grid for controlling the display intensity, said waveform outputs being converted to analog values and applied to said vertical deflection system, and said time dot outputs being coupled to said control grid.

4. A display system in accordance with claim 3 wherein said display system further includes means responsive to said addressing means for producing a horizontal drive signal for said horizontal deflection system.

5. A display system in accordance with claim 4 wherein said addressing means comprises an address counter which produces a sequential count signal, and said horizontal drive producing means comprises a digital-to-analog converter responsive to said count signal, wherein said time dot memory and said digital-to-analog converter receive the same count signal.

* * * * *